(12) United States Patent
Adachi et al.

(10) Patent No.: US 7,013,090 B2
(45) Date of Patent: Mar. 14, 2006

(54) TRANSMITTING CIRCUIT APPARATUS AND METHOD

(75) Inventors: Hisashi Adachi, Minoo (JP); Masanori Iida, Katano (JP); Hiroyuki Asakura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 717 days.

(21) Appl. No.: 10/081,708

(22) Filed: Feb. 21, 2002

(65) Prior Publication Data

US 2002/0186440 A1    Dec. 12, 2002

(30) Foreign Application Priority Data

Feb. 22, 2001    (JP)    ............................. 2001-047447

(51) Int. Cl.
*H04B 10/00*    (2006.01)
(52) U.S. Cl. ...................................... 398/183; 398/185

(58) Field of Classification Search ......... 398/182–201
See application file for complete search history.

(56) References Cited

U.S. PATENT DOCUMENTS 5,952,895 A      9/1999   McCune, Jr. et al.
6,647,250 B1 *  11/2003   Bultman et al. ............ 455/102

\* cited by examiner

*Primary Examiner*—Agustin Bello
(74) *Attorney, Agent, or Firm*—RatnerPrestia

(57) ABSTRACT

A transmitting circuit apparatus has
  a frequency modulator that performs frequency modulation of a carrier wave with frequency modulation data and outputs the frequency-modulated carrier wave;
  a sigma-delta modulator which performs sigma delta modulation of amplitude modulation data; and
  an amplitude modulator that performs amplitude modulation of the frequency-modulated carrier wave with an output signal of the sigma-delta modulator and outputs the amplitude-modulated carrier wave.

18 Claims, 15 Drawing Sheets

OUTPUT SIGNAL OF FREQUENCY MODULATOR

AMPLITUDE MODULATION DATA

OUTPUT SIGNAL OF SIGMA-DELTA MODULATOR

TRANSMITTING CIRCUIT APPARATUS AND METHOD

BACKGROUND OF THE INVENTION

1. Field of the Invention

The present invention relates to a transmitting circuit apparatus and method used in radio communications.

2. Related Art of the Invention

In a transmitting circuit apparatus used in a digital radio communication using modulation techniques such as QPSK, it is common to use an orthogonal modulator as a modulator. The basic configuration of a conventional transmitting circuit apparatus is shown in FIG. 14. That is, FIG. 14 shows an orthogonal modulator 403, a band pass filter 404, an IQ signal generator 405, a local oscillator 406, a phase shifter 407, mixers 408 and 409, a synthesizer 410, and a power amplifier 411.

The IQ signal generator 405 inputs digital data to divide it into two lines, and generates a baseband I signal and a baseband Q signal, which are analog signals, from respective lines to output the signals to an orthogonal modulator 403 respectively.

The orthogonal modulator 403 comprises the phase shifter 407, mixers 408 and 409, and synthesizer 410.

The local oscillator 406 outputs a sinusoidal wave signal at a carrier frequency, and a limiting signal at the carrier frequency that is outputted is divided into two signals, whose phases are different by 90 degrees from each other, by the phase shifter 407, the two signals which are inputted into the mixer 408 and mixer 409 respectively.

The mixers 408 and 409 perform the amplitude modulation of the signals at the carrier frequency, whose phases differ by 90 degrees from each other, with the baseband I signal and Q signal respectively, the signals that are synthesized by the synthesizer 410 and become an output of the orthogonal modulator 403.

The output of the orthogonal modulator 403 is amplified by the power amplifier 411, and a residual component after reduction of its unnecessary frequency component by the band pass filter is outputted.

In addition, an example of a transmitting circuit apparatus used for an optical base station used in mobile communications etc. is shown in FIG. 15 as another conventional example.

In order to enable a radio terminal to be used in an underground shopping center which an electric wave of a master station does not reach, the optical base station has the configuration of connecting a master station, which has all the control functions of the base station, to a slave station, which is used as a front end to a radio signal, via an optical fiber. Since FIG. 15 shows the similar configuration to that in FIG. 14 except the connection between the orthogonal modulator 403 and power amplifier 411 via an optical fiber, the same reference numerals are given to the same parts and detailed explanation will be omitted.

FIG. 15 shows a master station 421, a slave station 422, an E/O converter 423, an O/E converter 424, and an antenna 420.

In the master station 421, the E/O converter 423 comprising a laser diode converts an output of the orthogonal modulator 421 into an optical signal from an electric signal and the optical signal is transmitted to the slave station 422 through the optical fiber 425.

The slave station 422 converts into an electric signal the optical signal received by the O/E converter 424 comprising a photo diode, amplifies the electric signal by the power amplifier 411, removes an unnecessary frequency component by the band pass filter 404, and transmits the electric signal from an antenna 420.

In this conventional transmitting circuit apparatus, since inputs of the orthogonal modulator 403 are analog signals, it is necessary for the analog signals not to be distorted in the mixers 408 and 409. Therefore, it is difficult to sufficiently enlarge an output level of the orthogonal modulator 403.

In addition, although it is necessary to amplify an output of the orthogonal modulator 403 by the power amplifier 411 since the output level of the orthogonal modulator 403 cannot be sufficiently enlarged, it is necessary to operate the power amplifier 411 in a sufficiently small level to a saturation level since it is necessary to also operate the power amplifier 411 in a linear area with little distortion. Therefore, since the power consumption of the power amplifier 411 is large, it is not possible to make the power consumption of the whole transmitting circuit apparatus small.

In addition, the configuration in FIG. 15 showing an transmitting circuit apparatus of an optical base station which is another conventional example also requires the linearity of the E/O converter 423, optical fiber 425, and O/E converter 422 in addition to the large power consumption of the power amplifier 411. Therefore, although the configuration of the slave station is simple, it becomes difficult to obtain linearity as power consumption increases substantially.

Thus, a conventional transmitting circuit apparatus has an issue that power consumption cannot be made small.

SUMMARY OF THE INVENTION

In consideration of the above-described issues, the present invention aims to provide a transmitting circuit apparatus and method having good linearity, high transmission output power efficiency, and small power consumption.

One aspect of the present invention is a transmitting circuit apparatus comprising:

a frequency modulator that performs frequency modulation of a carrier wave with frequency modulation data and outputs the frequency-modulated carrier wave;

a sigma-delta modulator which performs sigma delta modulation of amplitude modulation data; and an amplitude modulator that performs amplitude modulation of the frequency-modulated carrier wave with an output signal of the sigma-delta modulator and outputs the amplitude-modulated carrier wave.

Another aspect of the present invention is the transmitting circuit apparatus, wherein the amplitude modulation data has multiple digital values, and wherein the sigma-delta modulator modulates the amplitude modulation data to amplitude data having binary digital values.

Still another aspect of the present invention is the transmitting circuit apparatus, wherein the sigma-delta modulator is at least a second-order or higher-order sigma-delta modulator.

Yet still another aspect of the present invention is the transmitting circuit apparatus, comprising a band pass filter which reduces an unnecessary signal out of a transmitted frequency band of an output signal of the amplitude modulator and outputs the output signal.

Still yet another aspect of the present invention is the transmitting circuit apparatus, wherein the amplitude modulator has a power amplifier and performs amplitude modulation by controlling a power supply of the power amplifier on the basis of an output signal of the sigma-delta modulator.

A further aspect of the present invention is the transmitting circuit apparatus, wherein a class B or class C power amplifier is provided in an output stage of the amplitude modulator.

A still further aspect of the present invention is the transmitting circuit apparatus, wherein the frequency modulator has a phase-locked oscillator, which includes at least a variable frequency divider, and a second sigma-delta modulator, wherein the second sigma-delta modulator outputs a value, which is obtained by performing second-order or higher-order sigma-delta modulation of data which is obtained by adding the frequency modulation data to carrier frequency data, as a division number of the variable frequency divider, and wherein the frequency-modulated carrier wave is outputted from the phase-locked oscillator.

A yet further aspect of the present invention is the transmitting circuit apparatus, wherein the frequency modulator has a phase comparator, a loop filter, a voltage-controlled oscillator, a mixer, and an IF modulator, wherein the IF modulator outputs a modulated wave signal at an intermediate frequency that is given frequency modulation with the frequency modulation data, wherein the mixer performs frequency conversion of an output signal of the voltage-controlled oscillator to an intermediate frequency with a channel selection signal, wherein the phase comparator performs phase comparison of the frequency-converted signal to a modulated wave signal at the intermediate frequency, wherein the loop filter reduces an unnecessary signal from the phase-compared signal, and wherein the voltage-controlled oscillator outputs the frequency-modulated carrier wave by its oscillation frequency being controlled by the signal where the unnecessary signal is reduced.

A still yet further aspect of the present invention is the transmitting circuit apparatus, comprising:

a first E/O converter that converts the frequency-modulated carrier wave from an electric signal into an optical signal;

a first O/E converter that is connected to the first E/o converter via an optical fiber and converts an optical signal, which is converted by the first E/O converter, into an electric signal;

a second E/O converter that converts an output signal of the sigma-delta modulator into an optical signal whose wavelength is different from that of an output of the first E/O converter;

a second O/E converter that is connected to the second E/O converter via the optical fiber and converts an optical signal, which is converted by the second E/O converter, into an electric signal, wherein an output signal of the second E/O converter is synthesized with an output signal of the first E/O converter, and is branched after being transmitted via the optical fiber to be converted into an electric signal from the optical signal by the second O/E converter, and wherein the amplitude modulator performs amplitude modulation of an output signal of the first O/E converter with an output signal of the second O/E converter.

An additional aspect of the present invention is the transmitting circuit apparatus, comprising:

an E/O converter which converts a signal, which is obtained by synthesizing a carrier wave, which is given the frequency modulation by the frequency modulator, and amplitude data which has digital values which are outputted from the sigma-delta modulator, from an electric signal into an optical signal; and an O/E converter which is connected to the E/O converter via an optical fiber and converts a converted signal from an optical signal into an electric signal, wherein a signal converted by the O/E converter is divided into the frequency-modulated carrier wave and the amplitude data by a filter, and wherein the amplitude modulator performs amplitude modulation of the frequency-modulated carrier wave, which is separated, with the amplitude data that is separated.

A still additional aspect of the present invention is the transmitting circuit apparatus, wherein the sigma-delta modulator has:

an n-th integrator generating a signal obtained by performing n-th integration of the amplitude modulation data, a quantizer which quantizes the n-th-integrated signal into a digital value, and a feedback circuit which feeds back the quantized value to an input value of the sigma-delta modulator, wherein the quantized digital value becomes an output of the sigma-delta modulator, and wherein the fed-back value is added to an input value of the sigma-delta modulator and is inputted into the n-th integrator.

A yet additional aspect of the present invention is the transmitting circuit apparatus, wherein the sigma-delta modulator has a plurality of low-order sigma-delta modulators that is connected in multiple stages, and wherein outputs of the plurality of low-order sigma-delta modulators are connected to a differentiator including configuration expressed by $(1-z^{-1})^m$ in z-transform for a order m until the preceding stage respectively, and are synthesized.

| Description of Symbols | |
|---|---|
| 1, 302 | Frequency modulators |
| 2, 310 | Amplitude modulators |
| 3, 35, 303 | Sigma-delta modulators |
| 4, 311, 404 | Band pass filters |
| 5, 301 | Data generators |
| 21 | Amplifier |
| 22 | Power supply controller |
| 23 | Amplitude modulator |
| 25 | Dual gate FET |
| 31 | Voltage-controlled oscillator |
| 32 | Variable frequency divider |
| 33 | Phase comparator |
| 34 | Loop filter |
| 36 | Mixer |
| 37 | Local oscillator |
| 38 | IF modulator |
| 41, 201, 221 | Second-order integrators |
| 42, 147, 202, 222, 267 | Quantizers |
| 43, 203, 223 | Feedback circuits |
| 47, 149, 207, 211, 227, 268 | Multipliers |
| 46, 48, 51, 53, 141, 142, 144, 145, 206, 208, 210, 226, 228, 232, 234, 240, 258, 259, 260, 266 | Adders |
| 44, 52, 54, 143, 146, 148, 204, 209, 224, 231, 233 | Delay circuits |

| -continued | |
|---|---|
| Description of Symbols | |
| 45, 205, 225 | Doubling circuits |
| 200 | First second-order sigma-delta modulator |
| 220 | Second-order sigma-delta modulator |
| 230 | Second-order differential circuit |
| 256, 257, 261, 262, 263, 264, 265 | Coefficient multipliers |
| 304, 305, 322, 423 | E/O converters |
| 306 | Optical frequency synthesizer |
| 307 | Branching filter |
| 308, 309, 323, 424 | O/E converters |
| 312, 420 | Antennas |
| 313, 425 | Optical fibers |
| 421 | Master station |
| 422 | Slave station |
| 405 | IQ signal generator |
| 406 | Local oscillator |
| 407 | Phase shifter |
| 408, 409 | Mixers |
| 410 | Synthesizer |
| 411 | Power amplifier |

PREFERRED EMBODIMENTS OF THE INVENTION

Hereafter, embodiments of the present invention will be described by using FIGS. 1 to 10.

Embodiment 1

Figure 1:
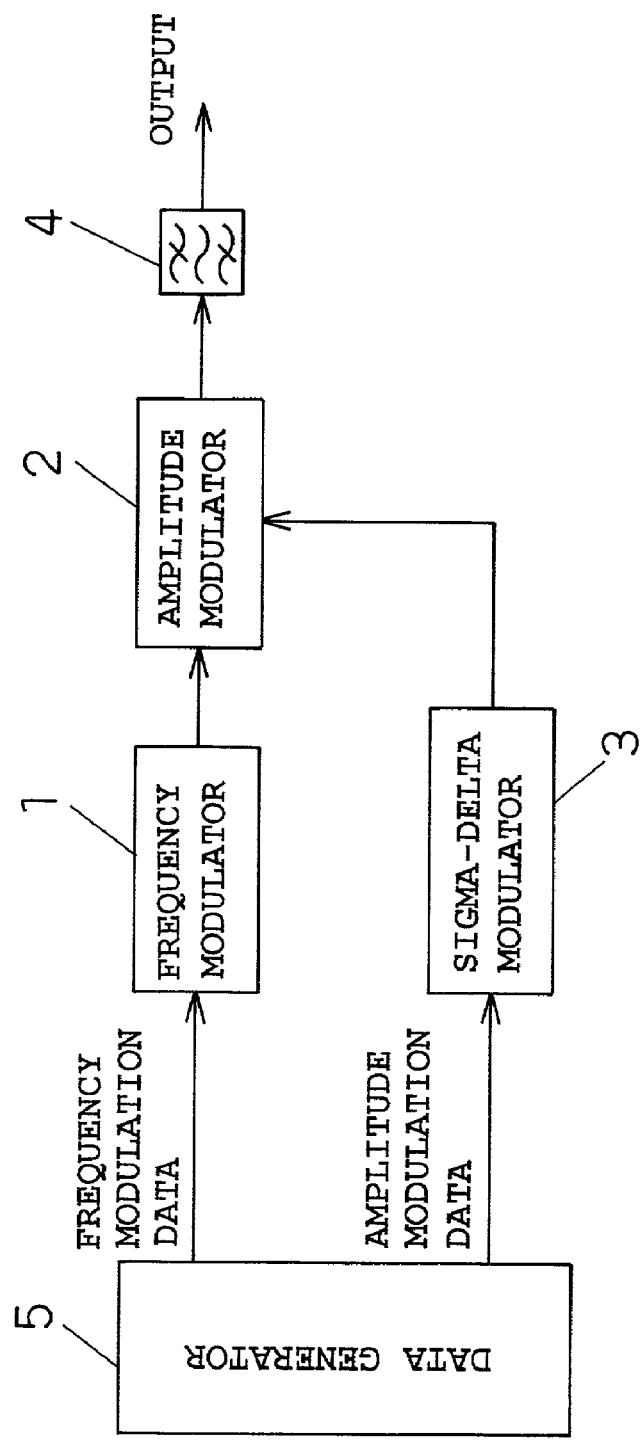
FIG. 1 is a block diagram of a transmitting circuit apparatus according to a first embodiment of the present invention.
Figure 2:
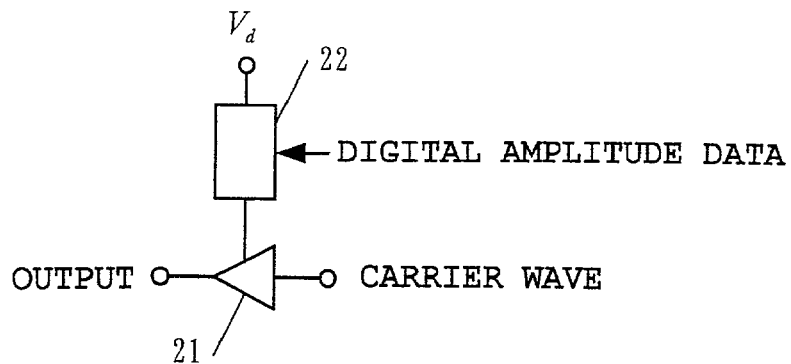
FIG. 2A is a block diagram of an amplitude modulator of the transmitting circuit apparatus according to the first embodiment of the present invention.
FIG. 2B is another block diagram of an amplitude modulator of the transmitting circuit apparatus according to the first embodiment of the present invention.
FIG. 2C is still another block diagram of an amplitude modulator of the transmitting circuit apparatus according to the first embodiment of the present invention.
FIG. 2D is a further block diagram of an amplitude modulator of the transmitting circuit apparatus according to the first embodiment of the present invention.
Figure 2:
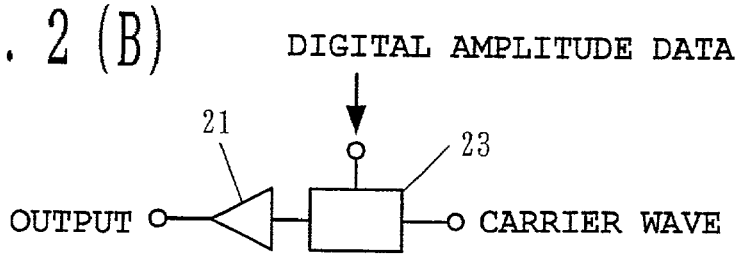
Figure 2:
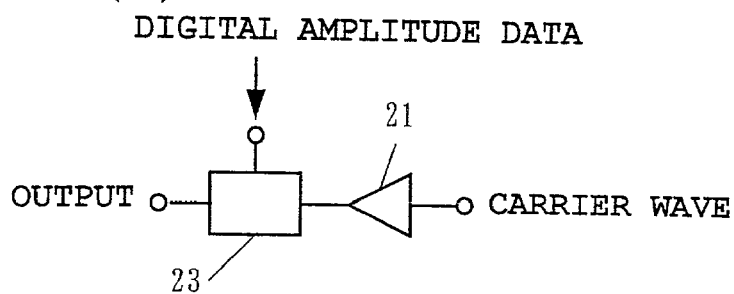
Figure 2:
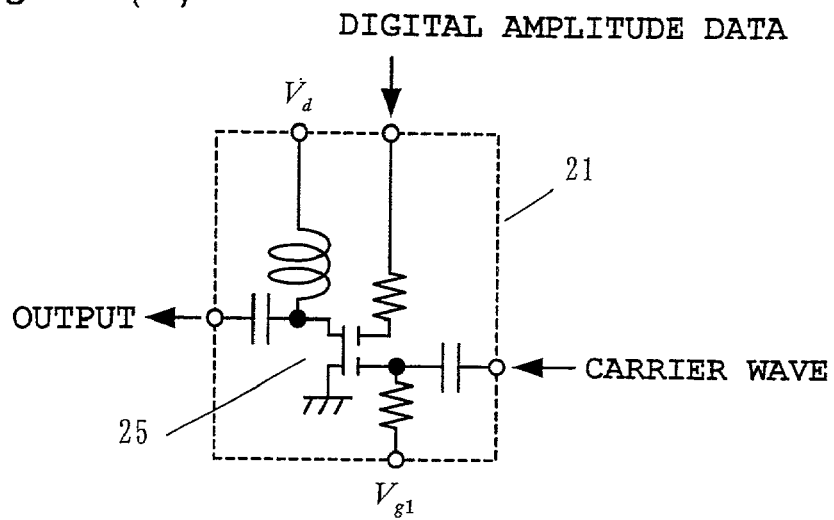
Figure 3:
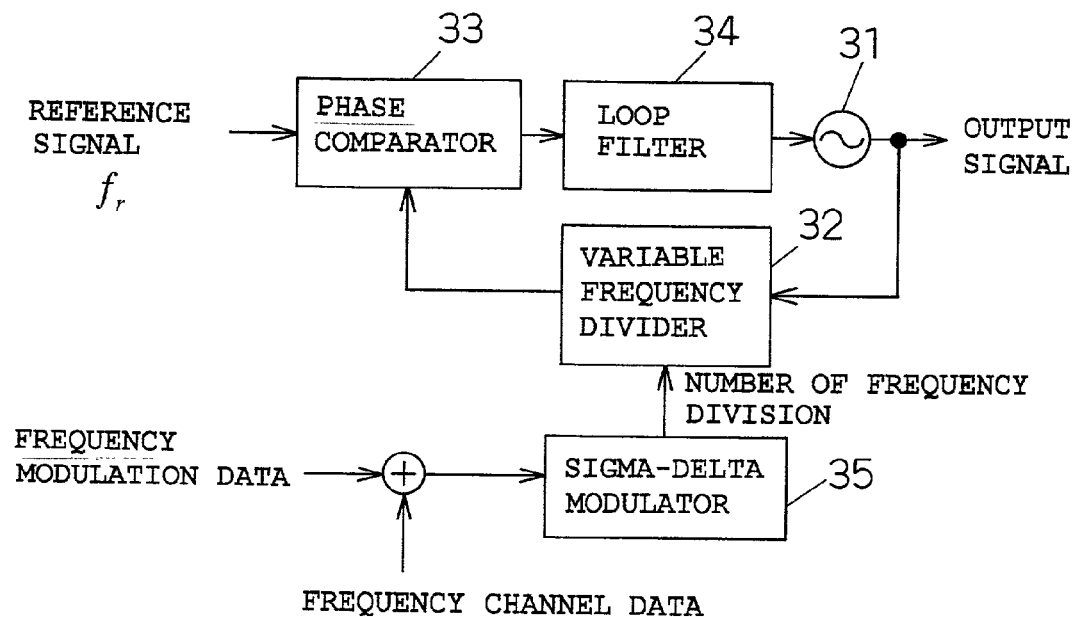
FIG. 3A is a block diagram of a frequency modulator of the transmitting circuit apparatus according to the first embodiment of the present invention.
FIG. 3B is another block diagram of a frequency modulator of the transmitting circuit apparatus according to the first embodiment of the present invention.
Figure 3:
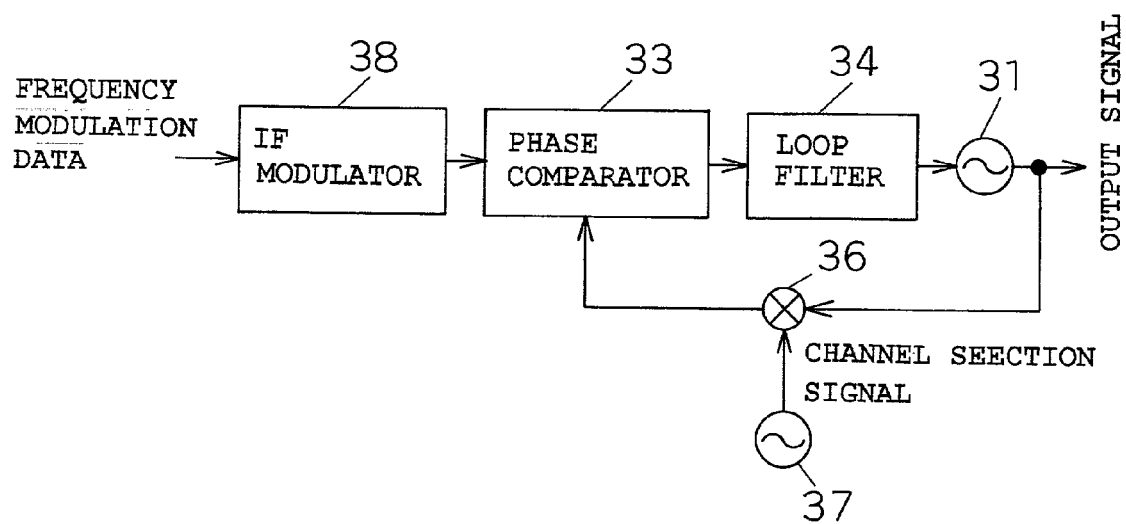

A basic configuration of a transmitting circuit apparatus according to an embodiment of the present invention is shown in FIG. 1. That is, FIG. 1 shows a frequency modulator 1, an amplitude modulator 2, a sigma-delta modulator 3, a band pass filter 4, and a data generator 5.

The data generator 5 is means of outputting vector modulation data constituted by frequency modulation data that is a digital signal, i.e., that has discrete values, and amplitude modulation data that is a digital signal, i.e., that has discrete values.

The frequency modulator 1 is means of performing the frequency modulation of a signal at the carrier frequency with the frequency modulation data.

The sigma-delta modulator 3 is a high-order sigma-delta modulator, and is means of performing the sigma-delta modulation of the amplitude modulation data, and outputting the digital amplitude data with a number of bits smaller than that of the amplitude modulation data.

The amplitude modulator 2 is means of performing the amplitude modulation of an output signal of the frequency modulator 1 with the digital amplitude data outputted from the sigma-delta modulator 3.

Figure 14:
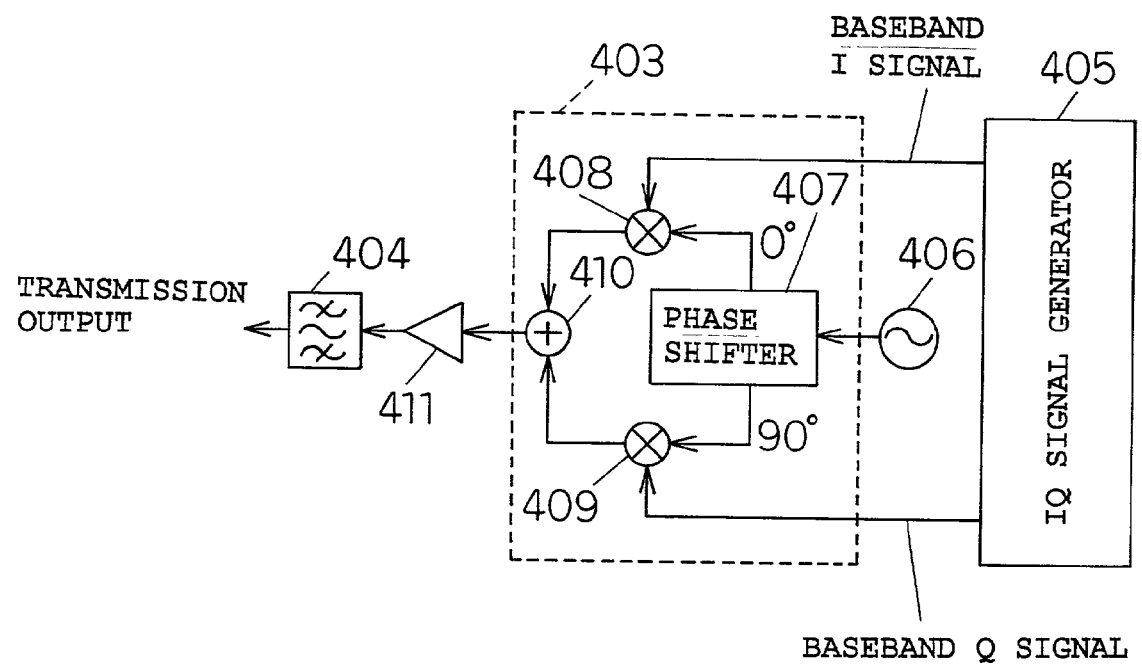
FIG. 14 is a block diagram of a conventional transmitting circuit apparatus.
Figure 15:
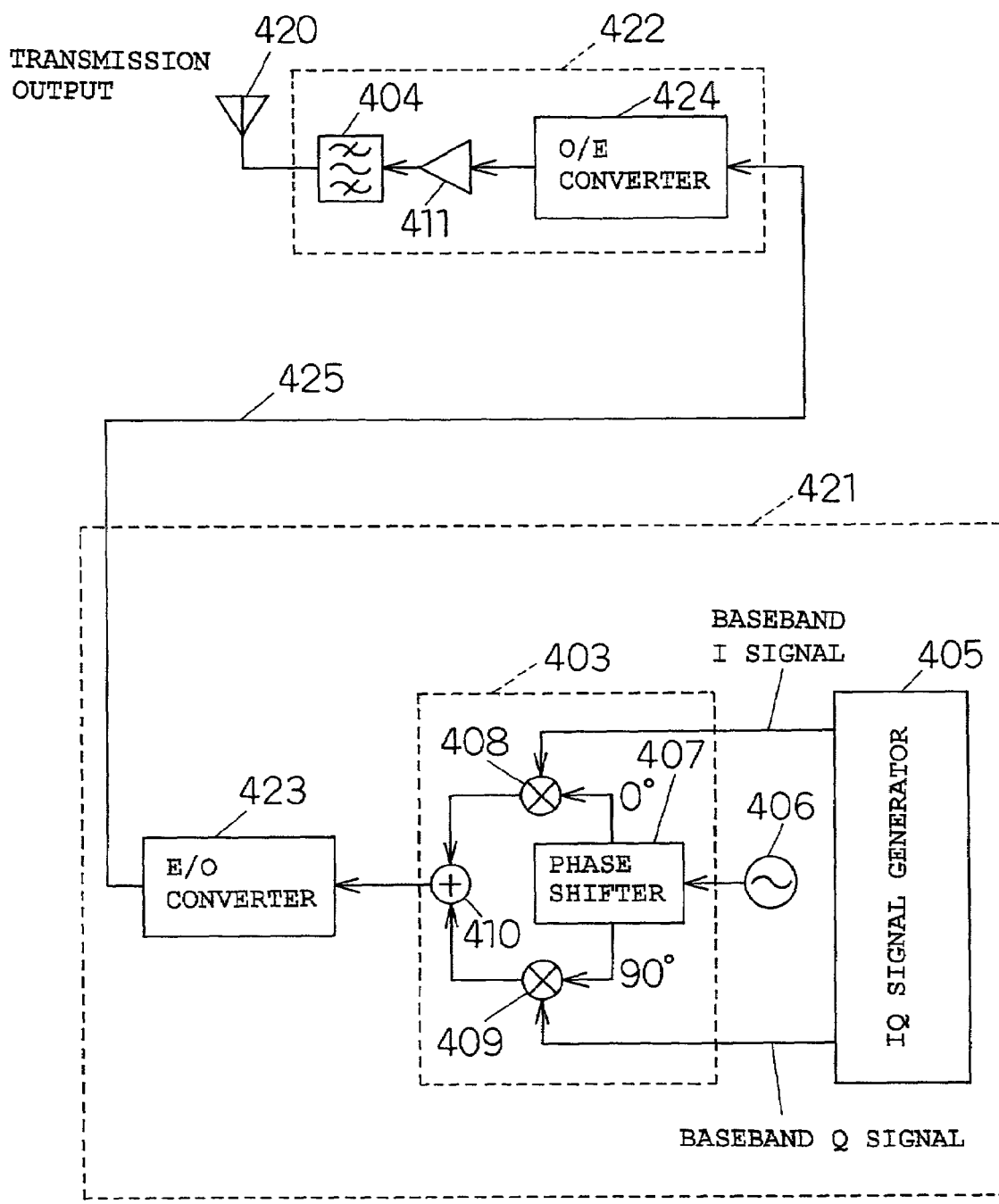
FIG. 15 is another block diagram of a conventional transmitting circuit apparatus.

The bandpass filter 4 is means of reducing an unnecessary frequency component from an output of the amplitude modulator 2. Although two band pass filters are necessary in the transmitting circuit apparatus using the conventional orthogonal modulator shown in FIG. 14, only one band pass filter is used in this embodiment. Thus, in the configuration of this embodiment, the number of the used band pass filters can be reduced in comparison with the conventional configuration.

Next, the operation and method of this embodiment will be described.

The data generator 5 generates vector modulation data. Thus the data generator 5 generates the frequency modulation data, which is a digital signal, and the amplitude modulation data, which is a digital signal as vector modulation data, and outputs these.

Figure 11:
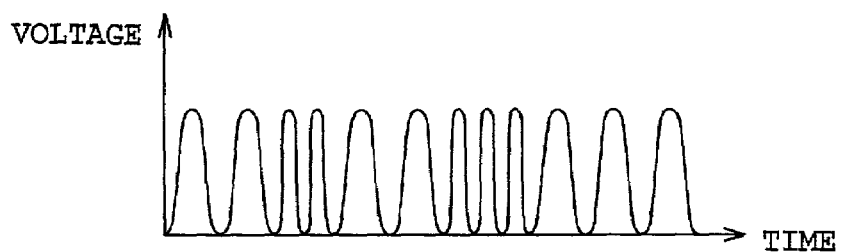
FIG. 11A shows an example of an output signal of a frequency modulator according to the first embodiment of the present invention.
FIG. 11B shows an example of amplitude modulation data according to the first embodiment of the present invention.
FIG. 11C shows an example of an output signal of a sigma-delta modulator according to the first embodiment of the present invention.
Figure 11:
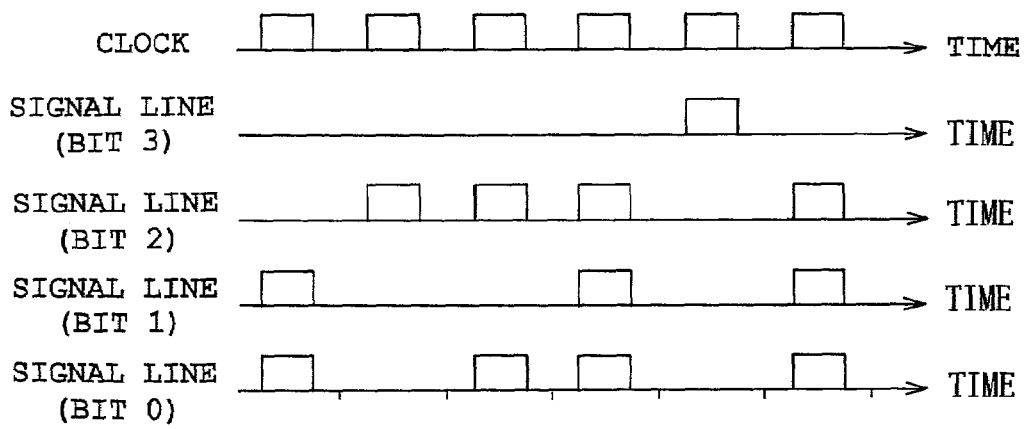
Figure 11:
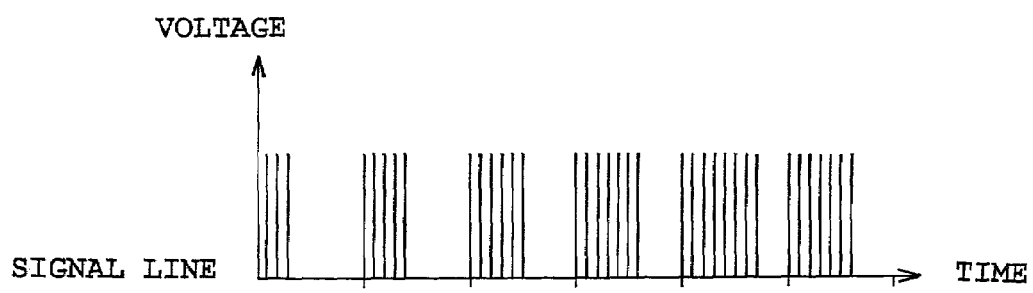

The frequency modulator 1 performs the frequency modulation of a signal at the carrier frequency with the frequency modulation data outputted from the data generator 5. An example of the signal that is given frequency modulation in the frequency modulator 1 is shown in FIG. 11A. It can be seen that the signal that is given frequency modulation becomes a signal with a constant envelope.

The sigma-delta modulator 3 is a high-order sigma-delta modulator, performs the sigma-delta modulation of the amplitude modulation data, and outputs the digital amplitude data with a number of bits smaller than that of the amplitude modulation data.

The amplitude modulation data in an input of the sigma-delta modulator 3 is shown in FIG. 11B. The amplitude modulation data is transmitted via a bus line where respective bits of data are transmitted with a plurality of signal lines with synchronizing with a clock signal, and is inputted into the sigma-delta modulator 3. In addition, output data from the sigma-delta modulator 3 is shown in FIG. 11C. In FIG. 11C, output data from the sigma-delta modulator 3 is modulated with binary digital amplitude data. In addition, although it is described in this embodiment that amplitude modulation data is transmitted via a bus line as shown in FIG. 11B, the amplitude modulation data may be transmitted as an analog signal with multiple values that has discrete voltage values. However, in this case, an AD converter corresponding to characteristics of the sigma-delta modulator 3 shall be used instead of the sigma-delta modulator 3.

The amplitude modulator 2 performs the amplitude modulation of an output signal of the frequency modulator 1 with digital amplitude data.

An output of the amplitude modulator 2 is outputted after its unnecessary frequency component is reduced by a band pass filter.

Since such an output of the frequency modulator 1 is a signal that is given frequency modulation, the output is a signal with a constant envelope. Although the amplitude modulator 2 performs amplitude modulation with values of digital amplitude data, what is necessary is to output only some kinds of output levels proportional to numeric values of the data since the number of bits of the digital amplitude data is small. Therefore, even if an amplitude modulator with low linearity is used, it is possible to easily perform level calibration.

In particular, when the sigma-delta modulator 3 has the configuration that its output is one bit, an amplitude modulator may be enough so long as it operates as a switch, and then, since it becomes possible to use the amplitude modulator 2 in a state near saturation, high efficiency can be obtained. In addition, since there are few components depending on analog characteristics, it becomes possible to obtain characteristics with sufficient linearity even if devices having large distortion are used.

A structural example of the amplitude modulator 2 is shown in FIG. 2A. A power supply controller 22 is controlled with binary digital amplitude data, and changes a supply voltage of an amplifier 21 stepwise to make the mean amplitude of an output signal proportional to each level of digital amplitude data. As for output amplitude, only several kinds of levels may be specified. Since the amplifier 21 only amplifies a carrier wave that is a sinusoidal wave, distortion except harmonics does not arise fundamentally. Therefore, even if the amplifier 21 is used under an operating condition near saturation, distortion generated near a transmitted output is small. In addition, since a current hardly flows in an OFF state, high efficiency can be attained.

Figure 12:
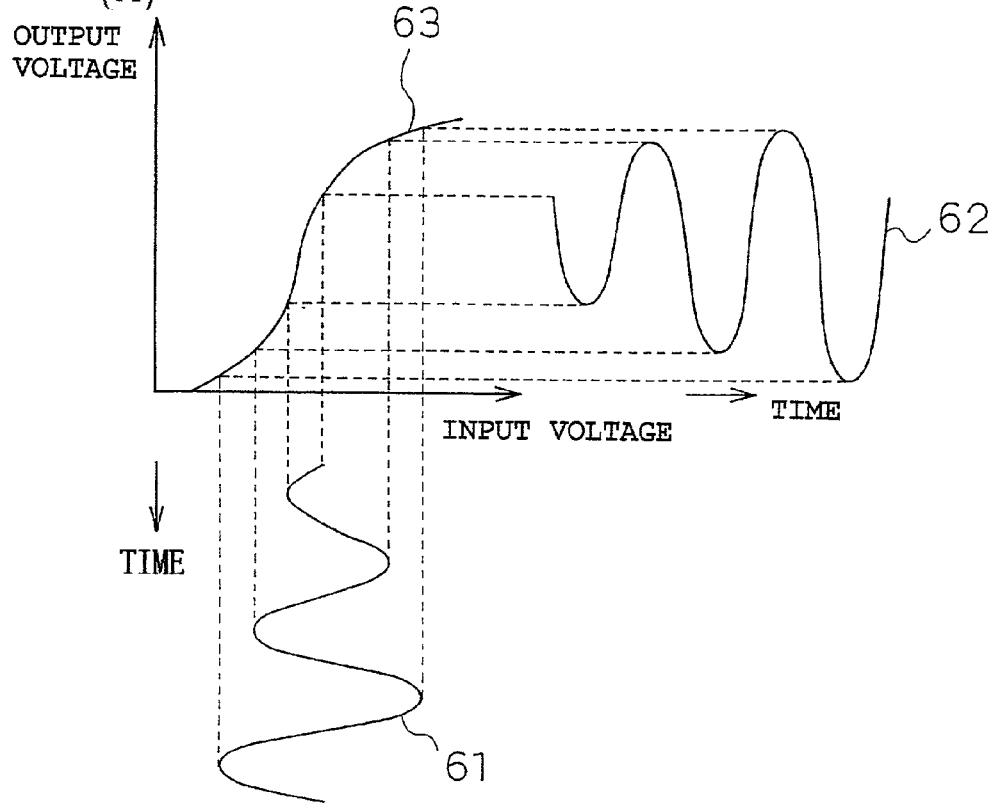
FIG. 12A is a conceptual diagram explaining the case, where an analog signal is amplified by an amplifier with nonlinear characteristics, in the first embodiment of the present invention.
FIG. 12B is a conceptual diagram explaining the case, where a digital signal is amplified by an amplifier with nonlinear characteristics, in the first embodiment of the present invention.
Figure 12:
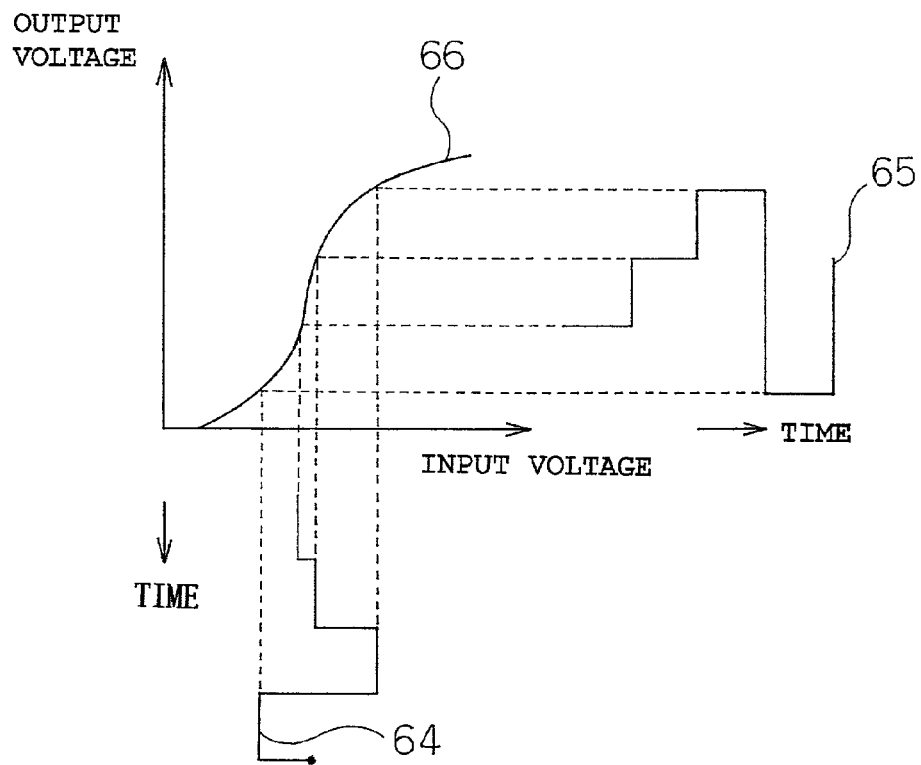

This will be described by using a conceptual diagram shown in FIGS. 12A and 12B. FIG. 12A is the conceptual diagram showing that an amplifier with an input-output characteristic 63 amplifies an input signal 61, and outputs an output signal 62. In FIG. 12A, the input signal 61 is an analog signal, and its input-output characteristic 63 is nonlinear. FIG. 12B is the conceptual diagram showing that an amplifier with an input-output characteristic 66 amplifies an input signal 64, and outputs an output signal 65. In FIG. 12B, the input signal 64 is a digital signal whose voltage changes stepwise, and its input-output characteristic 66 is nonlinear.

In FIG. 12A, since the input signal 61 has the nonlinear input-output characteristic 63, distortion arises as shown in the output signal 62 when amplified by an amplifier. In order to correct the distortion in the output signal 62, it is conceivable to perform the processing of the input signal 61 beforehand so as to be able to correct the nonlinearity of the input-output characteristic 63. However, since the input signal 61 is an analog signal and it is necessary to consider the input-output characteristic 63 in all the portions of the input signal 61, it is almost impossible to process the input signal 61 beforehand.

However, in FIG. 12B, since the input signal 64 is a digital signal whose voltage changes stepwise, it is possible to output the output signal 65 without distortion by adjusting only values that the input signal 64 can have stepwise even if the input-output characteristic 66 of an amplifier is nonlinear. Actually, in FIG. 12B, an interval of the values that the input signal 64 can have is adjusted beforehand so that intervals between steps that the output signal 65 can have may become equal.

Thus, when a supply voltage is a digital signal that has stepwise values, it is possible to obtain a desired output signal by making the supply voltage to the amplifier 21 inputted in a level corresponding to nonlinearity even if the characteristic of the amplifier 21 is nonlinear.

Figure 13:
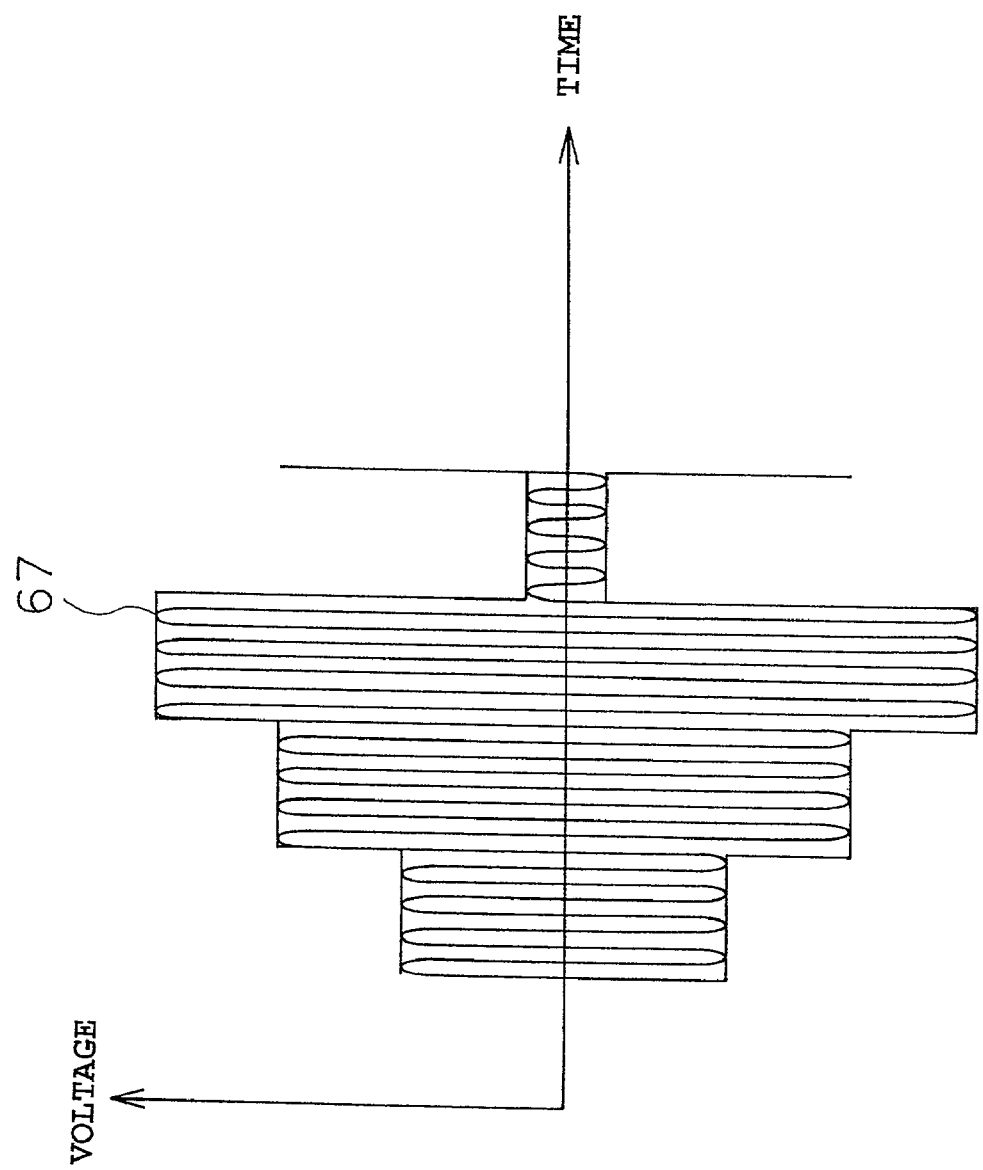
FIG. 13 shows an example of a carrier wave according to the first embodiment of the present invention.

Since the amplifier 21 only amplifies a carrier wave, which is a sinusoidal wave, in each stepwise voltage state, distortion except harmonics does not arise fundamentally. Thus, an example of a carrier wave 67 which the amplifier 21 amplifies is shown in FIG. 13. The carrier wave 67 is a signal whose sinusoidal amplitude changes stepwise. For this reason, at each step, even if the amplifier 21 had the nonlinear characteristic when amplifying the carrier wave 67, distortion except harmonics would not arise. Therefore, even if the amplifier 21 is used under an operating condition near saturation, distortion generated near a transmitted output is small. In addition, a current hardly flows in an OFF state. Therefore, high efficiency can be obtained.

In addition, even if the amplitude modulator 2 has any configuration shown in FIGS. 2B to 2D that are described below, what is described above can be said similarly.

Another structural example of the amplitude modulator 2 is shown in FIG. 2B. An amplitude modulator 23 is controlled with digital amplitude data. A carrier wave is controlled by the amplitude modulator 23, and is inputted into the amplifier 21 to be amplified. Power consumption at the time of an input in an OFF state can be reduced by making the amplifier 23 operate under bias conditions near class B or class C operation.

FIG. 2C shows a structural example where positions of the amplitude modulator 23 and an amplifier 21 in FIG. 2B are replaced mutually. Since the amplifier 23 amplifies a carrier wave with operating under conditions near saturation at the time of the maximum output, consumption current is small and a power supply of the amplifier itself is not fluctuated, and hence stable operation is possible.

Still another structural example of the amplitude modulator 2 is shown in FIG. 2D. An amplifier 21 is an amplifier using a dual gate FET 25. A carrier wave is inputted into a first gate, and is amplified and outputted. Digital amplitude data is inputted into a second gate, and controls an output level of the amplifier 25 stepwise. It is possible to easily obtain a high-speed control characteristic and a high-gain amplification characteristic by using the dual gate FET.

In the above-described FIGS. 2A, 2B, and 2D, when the digital amplitude data is binary, it is possible to greatly improve power consumption since the amplifier performs simple ON/OFF operation. In addition, in FIGS. 2B and 2C, since an RF switch can be used for the amplitude modulator 23, its configuration becomes simple. In addition, in FIGS. 2A to 2D, it is possible to attain high efficiency over the whole apparatus by using an amplifier as a final amplification stage of the whole transmitting circuit apparatus.

Structural examples of the frequency modulator 1 are shown in FIGS. 3A and 3B. That is, FIG. 3A shows a voltage-controlled oscillator 31, a variable frequency divider 32, a phase comparator 33, a loop filter 34, and a sigma-delta modulator 35. The sigma-delta modulator 35 may have the same configuration as that of the sigma-delta modulator 3 in FIG. 1 fundamentally.

An output of the voltage-controlled oscillator 31 is divided by the variable frequency divider 32, is given phase comparison to a reference signal by the phase comparator 33, passes through the loop filter 34, and controls an output frequency of the voltage-controlled oscillator 31. The sigma-delta modulator 35 performs the sigma-delta modulation of the data obtained by adding frequency modulation data and frequency channel data to output the data as a number of frequency division by the variable frequency divider 32. The sigma-delta modulator 35 operates at the same frequency as that of the reference signal. Here, the frequency channel data means data expressing a frequency of a channel used for transmission among respective channels assigned to the transmission frequency bands. The pass bandwidth of the loop filter 34 is larger than the frequency bandwidth of frequency modulation data, and sufficiently smaller than the frequency of the reference signal. Therefore, frequency modulation according to frequency modulation data is given to the output of the voltage-controlled oscillator 31, and an unnecessary high-frequency component generated by the sigma-delta modulator 35 is reduced by the loop filter 34. According to this configuration, since a phase-locked loop can operate with following the frequency modulation data even when the change of an output frequency to a control voltage of the voltage-controlled oscillator 31 is not linear, an accurate frequency modulation output can be obtained.

In addition, a set of phase comparator 33, loop filter 34, voltage-controlled oscillator 31, and a variable frequency divider 32 of this embodiment is an example of a phase-locked oscillator of the present invention, and the sigma-delta modulator 35 of this embodiment is an example of the second sigma-delta modulator of the present invention.

Another structural example of the frequency modulator 1 is shown in FIG. 3B. That is, FIG. 3B shows a mixer 36, a local oscillator 37, and an IF modulator 38.

The local oscillator 37 outputs a channel selection signal according to a desired channel frequency. The IF modulator 38 generates a modulation signal at an IF frequency that is modulated by frequency modulation data. An output of the voltage-controlled oscillator 31 is given frequency modulation into the IF frequency with the channel selection signal in the mixer 36, is given phase comparison to an output signal of the IF modulator 38 by the phase comparator 33, passes through the loop filter 34, and controls an output frequency of the voltage-controlled oscillator 31.

According to this configuration, since noise out of a frequency modulation band can be decreased by the loop filter 34, it is possible to prevent the degradation of noise characteristics by frequency conversion even if the orthogonal modulator at a common IF frequency band is used as the IF modulator 38.

Figure 4:
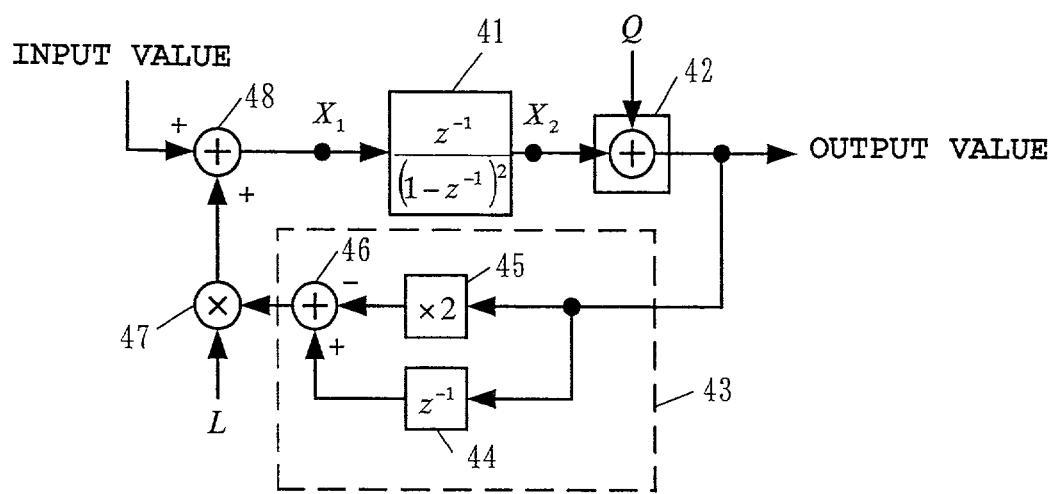
FIG. 4A is a block diagram of a sigma-delta modulator of the transmitting circuit apparatus according to the first embodiment of the present invention.
FIG. 4B is a block diagram of a second-order integrator used in the sigma-delta modulator according to the first embodiment of the present invention.
Figure 4:
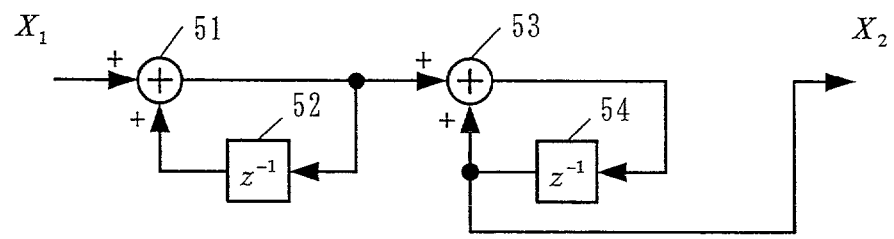

A structural example of the sigma-delta modulator 3 shown in FIG. 1 is shown in FIG. 4. That is, FIG. 4 shows a secondary integrator 41, a quantizer 42, a feedback circuit 43, a multiplier 47, and an adder 48.

The quantizer 42 quantizes an output of the secondary integrator 41 by a quantization unit L and outputs it. The quantized output value is multiplied by the quantization unit L in the multiplier 47 through the feedback circuit 43, is added to an input value in the adder 48, is inputted into the secondary integrator 41, and is given second-order integration to be outputted.

With letting the secondary integrator 41 A(z) in z-transform, $A(z)=z^{-1}/(1-z^{-1})^2$. In addition, with letting the feedback circuit 43 B(z) in z-transform, $B(z)=[(1-z^{-1})^2\ 1]/z^{-1}$. Here, $z^{-1}$ means a one clock delay element, and can be realized with a D flip-flop. The quantizer 42 divides an input value by the quantization unit L, and outputs an integer part of a quotient so that a remainder may not become negative. For example, in the case of L=1, input values 3, 1, 0, −1, and −3 are outputted for 3, 1, 1, 1, 0.3, −0.2, and −2.2, respectively. Division is realizable by outputting only the digits equal to or larger than the quantization unit L, and multiplication of the quantization unit L in the multiplier 47, and addition in the adder 48 are realizable by simply making an output of the feedback circuit 43 high order bits of an input value.

A structural example of the second-order integrator 41 is shown in FIG. 4B. An adder 51 and a delay circuit 52 constitute a first-order integrator. An output of the delay circuit 52 is added to an input value X1 in the adder 51, and an output of the adder 51 is inputted into the delay circuit 52. This first-order integrator is expressed in $1/(1-z^{-1})$ by z-transform. Similarly, an adder 53 and a delay circuit 54 constitute a first-order integrator. An output of the adder 51 is inputted into the adder 53, an output of the delay circuit 54 is added to it, and an output of the adder 53 is inputted into the delay circuit 54. An output of the delay circuit 54 becomes an output value X2 of the second-order integrator. The delay circuits 52 and 54 output input values with delaying them by one clock. Since an output of the delay circuit 54 is used for an output of the second-order integrator, the whole circuit of the second-order integrator is expressed in $z^{-1}/(1-z^{-1})^2$ by z-transform.

Here, with letting an input value in FIG. 4A be F and letting an output be Y, the configuration in FIG. 4A is expressed in $Y=F/L \cdot z^{-1}+(1-z^{-1})^2 Q$. This means that this circuit operates as a second-order sigma-delta modulator. In addition, in the case of the configuration expressed in $A(z)=1/(1-z^{-1})^2$, $B(z)=[(1-z^{-1})^2-1]$, $Y=F/L+(1-z^{-1})^2 Q$ holds, and hence, this operates as a similar sigma-delta modulator although its output is delayed by one clock.

On the other hand, a frequency characteristic for $|1-z^{-1}|$ is expressed in $|2\sin(\pi f/f_3)|$. Here, $f_3$ is a clock frequency. In the configuration in FIG. 4, quantizing noise Q is multiplied by the frequency characteristic of $|2\sin(\pi f/f_3)|^2$.

In addition, although the case where a quantizer performs the division of the input value by a quantization unit L is described here, it is possible to obtain a binary output as an output by making the output be +1 when the input value is zero or larger, and making the output be −1 when negative.

Figure 5:
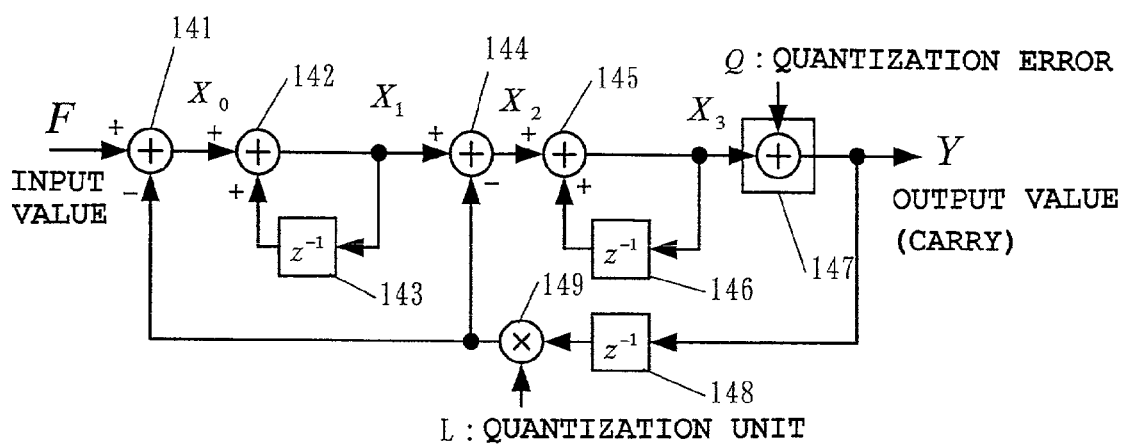
FIG. 5 is another block diagram of a sigma-delta modulator of the transmitting circuit apparatus according to the first embodiment of the present invention.

Another structural example of a second-order sigma-delta modulator is shown in FIG. 5. That is, FIG. 5 shows adders 141, 142, 144, and 145, delay circuits 143, 146, and 148, a multiplier 149, and a quantizer 147.

The quantizer 147 quantizes an output of the adder 145 by the quantization unit L and outputs it. The adder 142 and delay circuit 143 constitute a first first-order integrator, and the adder 145 and delay circuit 146 constitute a second first-order integrator. An output of the quantizer 147 passes through the delay circuit 148, and is multiplied by the quantization unit L by the multiplier 149 to be inputted into the adders 141 and 144. An output of the multiplier 149 inputted into the adder 141 is subtracted from the input value F of a sigma-delta modulator, is added to an output of the delay circuit 143 in the adder 142, and is inputted into the adders 144 and 143. An output of the adder 142 inputted into the adder 144 is given the subtraction of an output of the multiplier 149, is given the addition of an output of the delay circuit 146 in the adder 145, and is inputted into the delay circuit 146 and quantizer 147. In the configuration shown in FIG. 5, since the relation between the output Y and the input value F becomes $Y=F/L+(1-z^{-1})^2Q$, the same characteristics as those in FIG. 4 are demonstrated.

Figure 6:
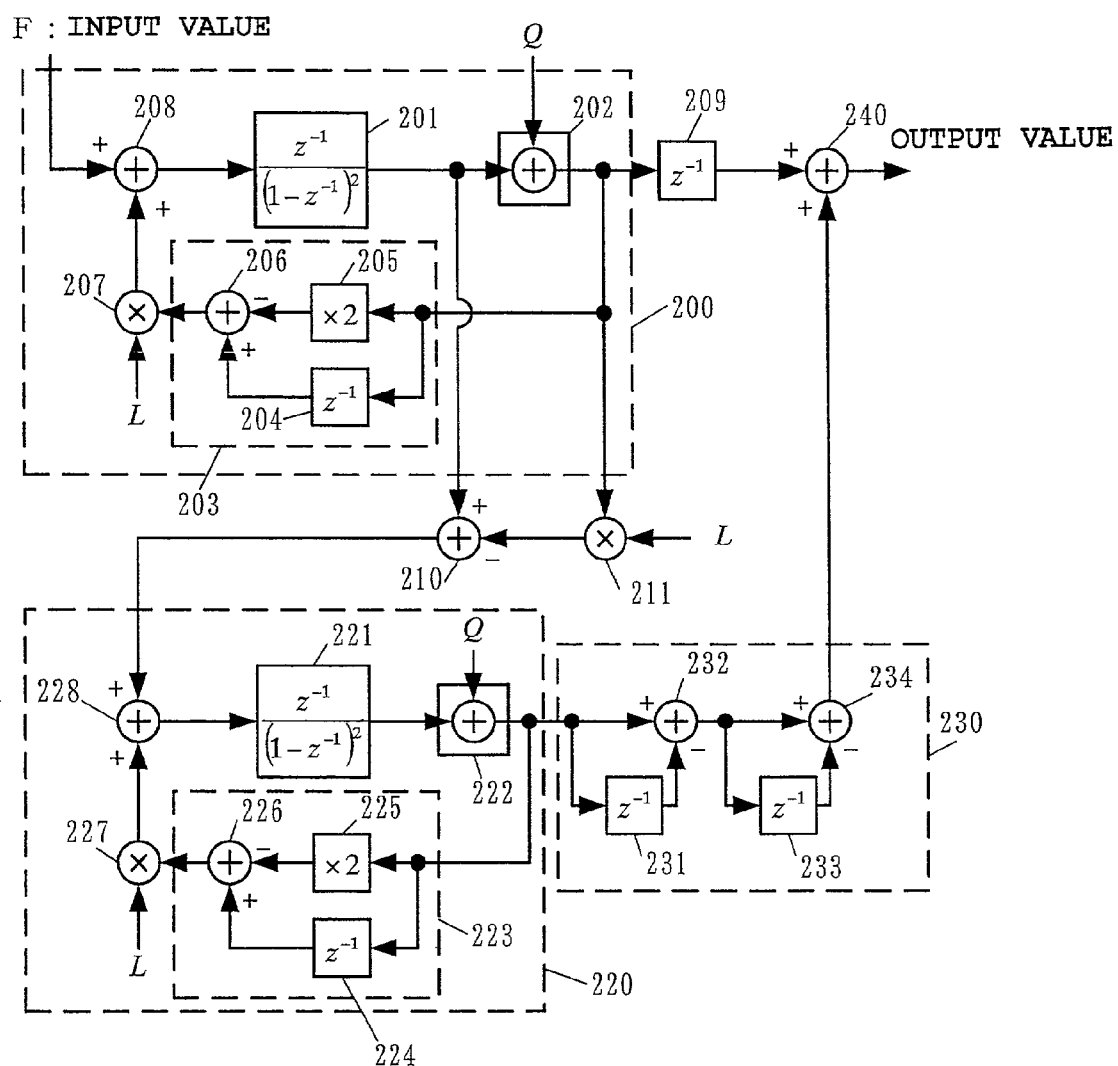
FIG. 6 is a block diagram of a sigma-delta modulator of the transmitting circuit apparatus according to the first embodiment of the present invention, the sigma-delta modulator having two stages of sigma-delta modulators shown in FIG. 4.

FIG. 6 shows the configuration of a sigma-delta modulator where two stages of sigma-delta modulators in FIG. 4 are used. That is, FIG. 6 shows a first second-order sigma-delta modulator 200, a second second-order sigma-delta modulator 220, and a second-order differential circuit 230. The first second-order sigma-delta modulator 200 comprises a second-order integrator 201, a quantizer 202, a feedback circuit 203, a multiplier 207, and an adder 208, and the feedback circuit 203 comprises a delay circuit 204, a doubling circuit 205, and an adder 206. The second-order sigma-delta modulator 220 comprises a second-order integrator 221, a quantizer 222, a feedback circuit 223, a multiplier 227, and an adder 228, and the feedback circuit 223 comprises a delay circuit 224, a doubling circuit 225, and an adder 226. The first second-order sigma-delta modulator 200 and second second-order sigma-delta modulator 220 have the same configuration as that in FIG. 5A, and detailed description will be omitted.

In the configuration shown in FIG. 6, the data of a fraction part that is inputted from the external is inputted into the first second-order sigma-delta modulator 200. An output of the quantizer 202 of the first second-order sigma-delta modulator 200 is connected to the delay circuit 209. The adder 210 subtracts an output of the quantizer 202 of the first second-order sigma-delta modulator 200 from an input of the quantizer 202, and outputs its remainder to the multiplier 211. The multiplier 211 multiplies an output of the adder 210 by the quantization unit L, and outputs its product to the second second-order sigma-delta modulator 220. An output of the quantizer 222 of the second second-order sigma-delta modulator 220 is inputted to the second-order differential circuit 230. The second-order differential circuit 230 comprises a delay circuit 231, an adder 232, a delay circuit 233, and an adder 234. The delay circuit 231 and adder 232, and the delay circuit 233 and adder 234 constitute respective first-order differential circuits. An input of the second-order differential circuit 230 is inputted into the delay circuit 231 and adder 232. The adder 232 subtracts an output of the delay circuit 231 from the input of the second-order differential circuit 230, and outputs its remainder to the delay circuit 233 and adder 234 that are the following stages. The adder 234 subtracts an output of the delay circuit 233 from the output of the adder 232 that is the output of the preceding stage, and outputs its remainder. The adder 240 adds an output of the delay circuit 209 to the output of the second-order differential circuit 230, and makes its sum an output of the whole circuit.

The operation of the sigma-delta modulator constituted as described above will be described below. With letting an output of the first second-order sigma-delta modulator 200 be $Y_1$ and letting a quantizing error a rising in the quantizer 202 be $Q_1$, the first second-order sigma-delta modulator 200 is expressed in $Y_1=z^{-1}F/L+(1-z^{-1})^2Q_1$ by z-transform. With letting an input and output of the second second-order sigma-delta modulator 220 be $F_2$ and $Y_2$, respectively and letting a quantizing error arising in the quantizer 222 be $Q_2$, the second second-order sigma-delta modulator 220 is expressed in $Y_2=z^{-1}F_2/L+(1-z^{-1})^2Q_2$ by z-transform. Here, since $F_2=LQ_1$, $Y_2=z^{-1}Q_1+(1-z^1)^2Q_2$. In addition, since the second-order differential circuit 230 is expressed in $(1-z^{-1})^2$, an output $Y_3$ of the second-order differential circuit becomes $Y_3=(1-z^{-1})^2Y_2=-z^{-1}(1-z^{-1})^2Q_1+(1-z^{-1})^4Q_2$. Therefore, an output $Y_4$ of the adder 240 becomes $Y_4=z^{-1}Y_1+Y_3=-z^{-2}F/L+(1-z^{-1})^4Q_2$. This means that this circuit operates as a fourth-order sigma-delta modulator.

As described above, a frequency characteristic for $|1-z^{-1}|$ is expressed in $|2\sin(\pi f/f_3)|$. Here, $f_3$ is a clock frequency. Hence, in the fourth-order sigma-delta modulator in FIG. 6, quantizing noise Q is multiplies by the frequency characteristic of $|2\sin(\pi f/f_3)|^4$. Therefore, in comparison with the coefficient of the quantizing noise Q in the above-described second-order sigma-delta modulator, a degree of suppression of the quantizing noise in a low-frequency range becomes still larger.

In addition, generally, about n and m that are one or more, when combining a first n-th order sigma-delta modulator and a second m-th order sigma-delta modulator, by adjusting the delay of an output of the first n-th order sigma-delta modulator by providing an n-th order differential circuit in an output of the second m-th order sigma-delta modulator, it is possible to make them a (n+m)-th order sigma-delta modulator as a whole. It is apparent that it is also possible to combine three or more modulators similarly.

Figure 7:
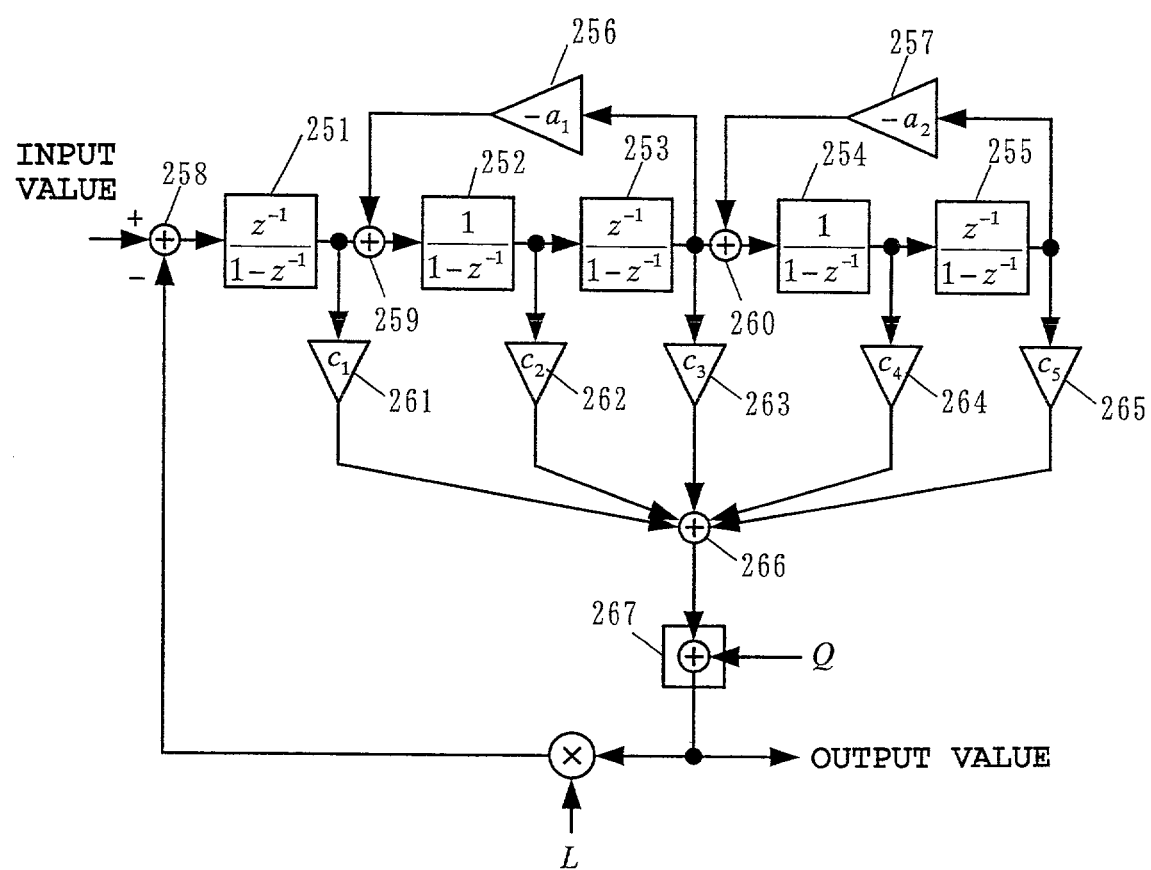
FIG. 7 is a block diagram of a fifth order sigma-delta modulator of the transmitting circuit apparatus according to the first embodiment of the present invention.

A structural example of a fifth-order sigma-delta modulator is shown in FIG. 7. That is, FIG. 7 shows first-order integrators 251, 252, 253, 254, and 255, adders 258, 259, and 260, coefficient multipliers 256, 257, 261, 262, 263, 264, and 265, a quantizer 267, and a multiplier 268.

The quantizer 267 quantizes an output of the adder 266, and the quantizer 268 outputs a value obtained by the multiplication of the quantization unit L to the adder 258. The adder 258 subtracts an output of the quantizer 267 from an input value of the sigma-delta modulator. The first-order integrator 251 performs the first-order integration of an output of the adder 258. The adder 259 adds an output of the first-order integrator 251 to an output of the coefficient multiplier 256. The first-order integrator 252 performs the first-order integration of an output of the adder 259. An output of the first-order integrator 252 is given first-order integration by the first-order integrator 253 and is multiplied by a coefficient by the coefficient multiplier 256. The adder 260 adds an output of the first-order integrator 253 to an output of the coefficient multiplier 257. The first-order integrator 254 performs the first-order integration of an output of the adder 260. An output of the first-order integrator 254 is given first-order integration by the first-order integrator 255 and is multiplied by a coefficient by the coefficient multiplier 257. Outputs of the first-order integrators 251 to 255 are multiplied by coefficients by the coefficient multipliers 261 to 265 respectively, and are added by the adder 266 to be inputted into the quantizer 267. According to this configuration, it is possible to arbitrarily change frequency characteristics of sigma-delta modulation by arbitrarily setting a coefficient of each coefficient multiplier.

Figure 8:
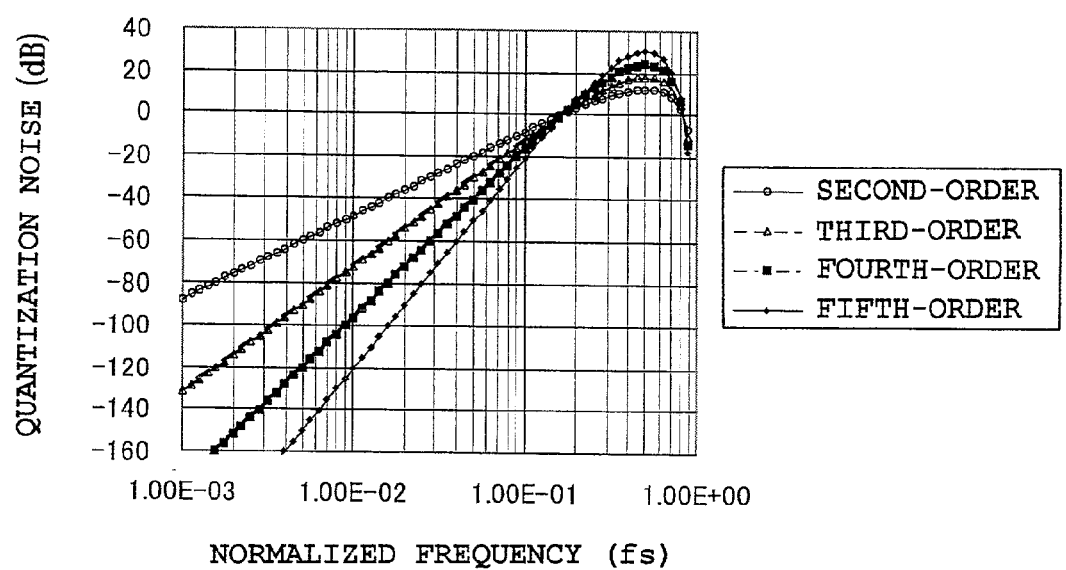
FIG. 8 shows frequency characteristics of quantizing noise to the orders of sigma-delta modulators.

An example of frequency characteristics of quantizing noise to the order of sigma-delta modulators is shown in FIG. 8. As shown in FIG. 8, as the order increases, the quantizing noise level in a low-frequency range is reduced. That is, it is possible to obtain an output, where the increase of quantizing noise is suppressed, in a low-frequency range even if the output has the number of bits coarser than an input value. In addition, an improvement factor can be enhanced by making a clock frequency high.

Embodiment 2

Figure 9:
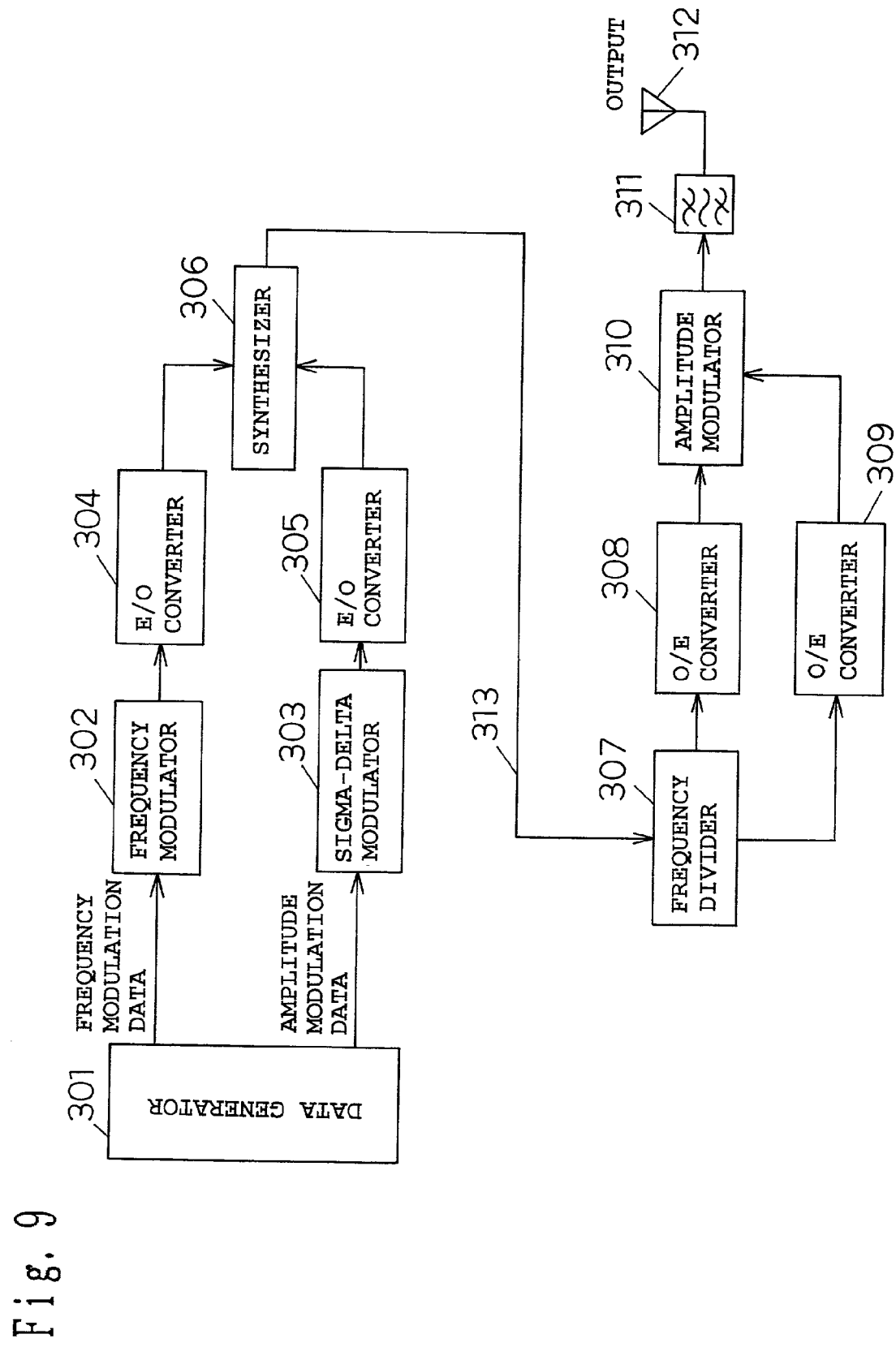
FIG. 9 is a block diagram of a transmitting circuit apparatus according to a second embodiment of the present invention.

FIG. 9 shows another embodiment of a transmitting circuit apparatus according to the present invention. FIG. 9 shows the configuration corresponding to the case that a frequency modulator and an amplitude modulator of the transmitting circuit apparatus in FIG. 1 are connected with an optical fiber. Since the contents shown in FIGS. 2 to 7 are applicable similarly, detailed description will be omitted. In addition, FIG. 9 shows a data generator 301, a frequency modulator 302, a sigma-delta modulator 303, E/O converters 304 and 305, a optical frequency synthesizer 306, a branching filter 307, O/E converters 308 and 309, an amplitude modulator 310, a band pass filter 311, an antenna 312, and an optical fiber 313. Outputs of the frequency modulator 302 and sigma-delta modulator 303 are converted into optical signals with E/O converters 304 and 305, respectively. The E/O converters 304 and 305 are laser diodes, and output light whose wavelengths differ from each other.

Frequency modulation data outputted from the data generator 301 is given frequency modulation by the frequency modulator 302, and is inputted into the E/O converter 304. In addition, amplitude modulation data outputted from the data generator 301 is given sigma-delta modulation by the sigma-delta modulator 303 to become digital amplitude data, and is inputted into the E/O converter 305. Outputs of the E/O converters 304 and 305 are synthesized by the optical frequency synthesizer 306, the signal is transmitted within the optical fiber 313 and is branched by the branching filter 307 for every wave length, and the signals are inputted into O/E converters 308 and 309, respectively.

The O/E converters 308 and 309 are photo diodes, and convert optical signals inputted into respective converters into a frequency modulation signal and digital amplitude data that are electric signals. The frequency modulation signal is given frequency modulation with the digital amplitude data by the amplitude modulator 310, its unnecessary frequency component is reduced by the band pass filter 311, and the frequency modulation signal is outputted from the antenna 312.

According to the above configuration, a frequency modulation signal with a constant envelope, and a digital signal are transmitted in a transmission part of an optical signal. Therefore, it is possible to enlarge tolerance to a distorted characteristic in the optical transmission part from an E/O converter to an O/E converter. In addition, it is possible to minimize signal processing after restoring to an electric signal by performing transmission after sigma-delta modulation without transmitting amplitude modulation data in a baseband digital signal with a large number of bits as it is.

Furthermore, since the power consumption of an amplitude modulator is made small like the first embodiment, it is possible to realize a small optical base station system with low power consumption.

Figure 10:
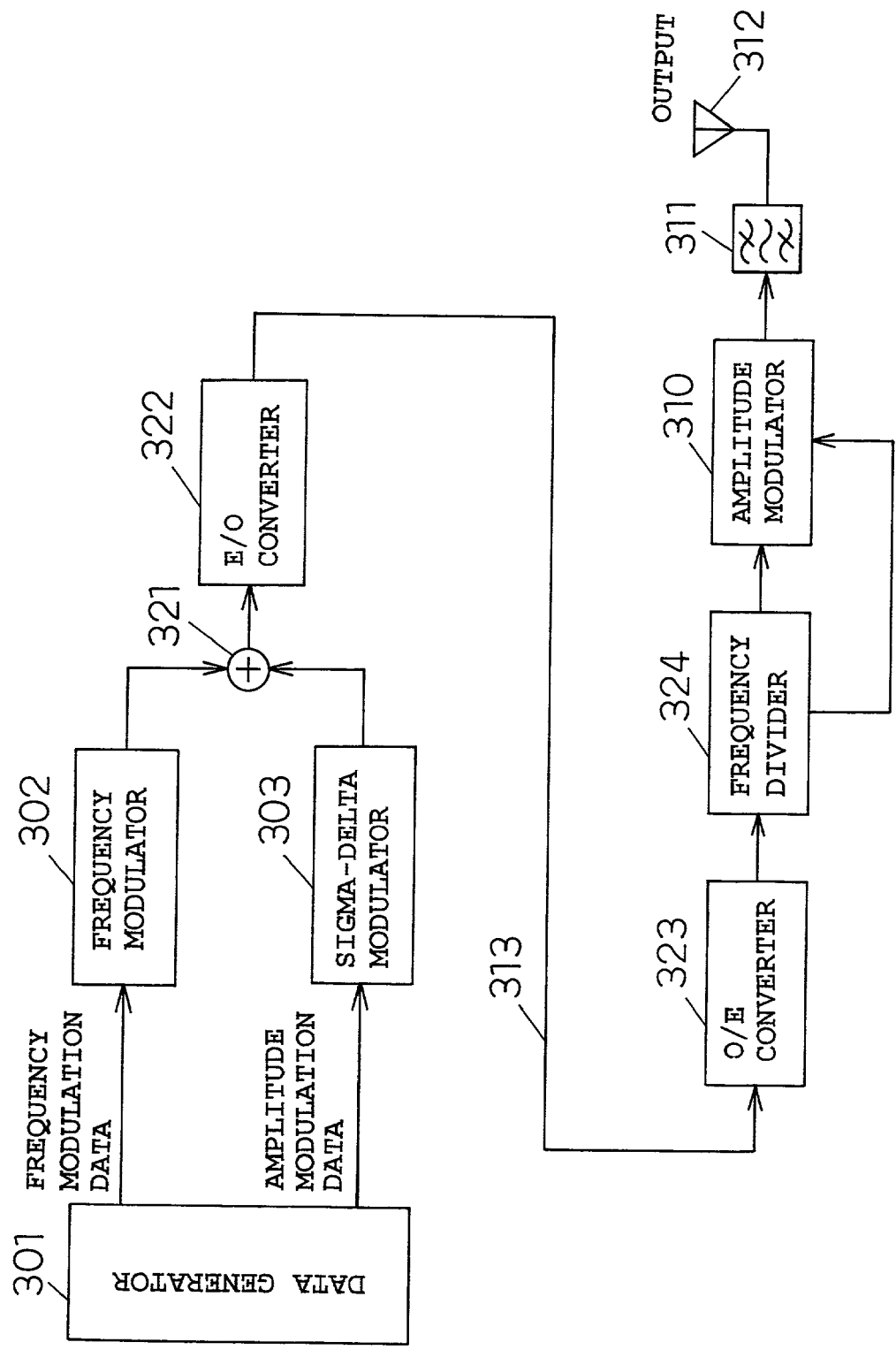
FIG. 10 is another block diagram of a transmitting circuit apparatus according to the second embodiment of the present invention.

FIG. 10 shows the configuration where a method of transmitting an optical signal differs from the configuration in FIG. 9. The same reference numerals are assigned to the same parts as those in FIG. 9, and detailed description will be omitted. That is, FIG. 10 shows a synthesizer 321, an E/O converter 322, an O/E converter 323, and a branching filter 324. An output signal of the frequency modulator 302 and digital amplitude data that is an output signal of the sigma-delta modulator 303 are synthesized by the synthesizer 321, and are converted into an optical signal by the E/O converter 322. The converted optical signal is transmitted through the optical fiber 313, and is converted into an electric signal by the O/E converter 323. An output of the O/E converter 323 is divided into a frequency modulation signal and digital amplitude data by the branching filter 324. The frequency modulation signal is given frequency modulation with the digital amplitude data by the amplitude modulator 310, its unnecessary frequency component is reduced by the band pass filter 311, and the frequency modulation signal is outputted from the antenna 312.

According to this configuration, it is possible to realize an O/E converter and an E/O converter in one converter. In addition, since frequencies of the frequency modulation signal and digital amplitude data greatly differ from each other, it is possible to realize the branching filter 324 with a simple filter.

Thus, according to this embodiment, it is possible to realize a transmitting circuit apparatus with sufficient linearity and low power consumption by outputting a carrier wave that is given frequency modulation by a frequency modulator, performing the sigma-delta modulation of amplitude modulation data by a sigma-delta modulator, performing the amplitude modulation of the carrier wave, which is given frequency modulation by the amplitude modulator, with a signal that is given sigma-delta modulation, and outputting the signal.

As apparent from the above description, the present invention can provide a transmitting circuit apparatus having good linearity, high transmission output power efficiency, and small power consumption.

In addition, the present invention can also obtain the following effects with the above-described effect.

Namely, since amplitude modulation data has discrete values with multiple values, when a sigma-delta modulator modulates amplitude modulation data into amplitude data having binary discrete values, the present invention can provide a transmitting circuit apparatus with the highest transmission output power efficiency, and the smallest power consumption.

In addition, when a sigma-delta modulator is a sigma-delta modulator with an order at least equal to or more than second order, the present invention can provide a transmitting circuit apparatus which can control a grade of increase of quantizing noise according to its order.

In addition, when having a band pass filter that reduces the unnecessary signal outside a transmission frequency band of an output signal of an amplitude modulator, the present invention can provide a transmitting circuit apparatus that can reduce an unnecessary frequency component resulting from quantizing noise peculiar to a sigma-delta modulator.

Furthermore, the present invention can provide a transmitting circuit apparatus with further high efficiency, wherein an amplitude modulator has a power amplifier and performs amplitude modulation by controlling a power supply of the power amplifier on the basis of an output signal of the sigma-delta modulator.

In addition, the present invention can provide a transmitting circuit apparatus with still further high efficiency, wherein an output of an amplitude modulator is equipped with a power amplifier in class B or class C operation.

In addition, the present invention can provide a transmitting circuit apparatus which obtains an accurate frequency modulation output, wherein a frequency modulator has a phase-locked oscillator, which include at least a variable frequency divider, and a second sigma-delta modulator, wherein the second sigma-delta modulator outputs a value, which is obtained by performing the second-order or higher sigma-delta modulation of the data obtained by adding frequency modulation data to carrier frequency data, as a number of division of the variable frequency divider, and wherein a carrier wave which is given frequency modulation is outputted from the phase-locked oscillator.

Furthermore, the present invention can provide a transmitting circuit apparatus, which can prevent the degradation of a noise characteristic by frequency conversion even if a general orthogonal modulator is used, wherein a frequency modulator has a phase comparator, a loop filter, a voltage-controlled oscillator, a mixer, and an IF modulator, wherein the IF modulator outputs a modulated wave signal at an intermediate frequency that is frequency-modulated with the frequency modulation data, wherein the mixer performs frequency conversion of an output signal of the voltage-controlled oscillator to an intermediate frequency with a channel selection signal, wherein the phase comparator performs phase comparison of the frequency-converted signal to a modulated wave signal at the intermediate frequency, wherein the loop filter reduces an unnecessary signal from the phase-compared signal, and wherein the voltage-controlled oscillator outputs the frequency-modulated carrier wave by its oscillation frequency being controlled by the signal where the unnecessary signal is reduced.

Moreover, the present invention can provide a transmitting circuit apparatus that can enlarge tolerance to distortion characteristics in an optical fiber and can transmit an optical signal via one optical fiber, comprising: a first E/O converter which converts the frequency-modulated carrier wave from an electric signal into an optical signal; a first O/E converter which is connected to the first E/O converter via an optical fiber and converts the optical signal, which is converted by the first E/O converter, into an electric signal; a second E/O converter which converts an output signal of the sigma-delta modulator into an optical signal whose wavelength is different from that of an output of the first E/O converter; and a second O/E converter which is connected to the second E/O converter via the optical fiber and converts an optical signal, which is converted by the second E/O converter, into an electric signal, wherein an output signal of the second E/O converter is synthesized with an output signal of the first E/O converter, and is branched after being transmitted via the optical fiber to be converted into an electric signal from the optical signal by the second O/E converter, and wherein the amplitude modulator performs amplitude modulation of an output signal of the first O/E converter with an output signal of the second O/E converter.

In addition, the present invention can provide a transmitting circuit apparatus that can transmit an optical signal by using only one O/E converter and one E/O converter, comprising: an E/O converter which converts a signal, which is obtained by synthesizing a carrier wave, which is frequency-modulated by the frequency modulator, and amplitude data, which has digital values which are outputted from the sigma-delta modulator, from an electric signal into an optical signal; and an O/E converter which is connected to the E/O converter via an optical fiber and converts a converted signal from an optical signal into an electric signal, wherein a signal converted by the O/E converter is divided into the frequency-modulated carrier wave and the amplitude data by a filter, and wherein the amplitude modulator performs amplitude modulation of the frequency-modulated carrier wave, which is separated, with the amplitude data that is separated.

In addition, the present invention can provide a transmitting circuit apparatus that can arbitrarily change a frequency characteristic, wherein a sigma-delta modulator has an n-th integrator generating a signal obtained by performing n-th integration of the amplitude modulation data, a quantizer which quantizes the n-th-integrated signal into a digital value, and a feedback circuit which feeds back the quantized value to an input value of the sigma-delta modulator, wherein the quantized digital value becomes an output of the sigma-delta modulator, and wherein the fed-back value is added to the input value of the sigma-delta modulator and is inputted into the n-th integrator.

Furthermore, the present invention can provide a transmitting circuit apparatus that can realize a higher-order sigma-delta modulator and hence can further reduce a distortion component caused by quantization noise, wherein the sigma-delta modulator has a plurality of low-order sigma-delta modulators that is connected in multiple stages, and wherein outputs of the plurality of low-order sigma-delta modulators are connected to a differentiator including configuration expressed in $(1-z^{-1})^m$ by z-transform to an order m until the preceding stage respectively, and are synthesized.

What is claimed is:

1. A transmitting circuit apparatus comprising:
   a frequency modulator that performs frequency modulation of a carrier wave with frequency modulation data and outputs the frequency-modulated carrier wave;
   a sigma-delta modulator which performs sigma delta modulation of amplitude modulation data; and
   an amplitude modulator that performs amplitude modulation of the frequency-modulated carrier wave with an output signal of the sigma-delta modulator and outputs the amplitude-modulated carrier wave;
   wherein the frequency modulator has a phase-locked oscillator, which includes at least a variable frequency divider, and a second sigma-delta modulator, wherein the second sigma-delta modulator outputs a value, which is obtained by performing second-order or higher-order sigma-delta modulation of data which is obtained by adding the frequency modulation data to carrier frequency data, as a division number of the variable frequency divider, and
   wherein the frequency-modulated carrier wave is outputted from the phase-locked oscillator.

2. The transmitting circuit apparatus according to claim 1, wherein the amplitude modulation data has multiple digital values, and
   wherein the sigma-delta modulator modulates the amplitude modulation data to amplitude data having binary digital values.

3. The transmitting circuit apparatus according to claim 1, wherein the sigma-delta modulator is at least a second-order or higher-order sigma-delta modulator.

4. The transmitting circuit apparatus according to claim 1, comprising a band pass filter which reduces an unnecessary signal out of a transmitted frequency band of an output signal of the amplitude modulator and outputs the output signal.

5. The transmitting circuit apparatus according to claim 1, wherein the amplitude modulator has a power amplifier and performs amplitude modulation by controlling a power supply of the power amplifier on the basis of an output signal of the sigma-delta modulator.

6. The transmitting circuit apparatus according to claim 1, comprising:
a first E/O converter that converts the frequency-modulated carrier wave from an electric signal into an optical signal;
a first O/E converter that is connected to the first E/O converter via an optical fiber and converts an optical signal, which is converted by the first E/O converter, into an electric signal;
a second E/O converter that converts an output signal of the sigma-delta modulator into an optical signal whose wavelength is different from that of an output of the first E/O converter;
a second O/E converter that is connected to the second E/O converter via the optical fiber and converts an optical signal, which is converted by the second E/O converter, into an electric signal,
wherein an output signal of the second E/O converter is synthesized with an output signal of the first E/O converter, and is branched after being transmitted via the optical fiber to be converted into an electric signal from the optical signal by the second O/E converter, and
wherein the amplitude modulator performs amplitude modulation of an output signal of the first O/E converter with an output signal of the second O/E converter.

7. The transmitting circuit apparatus according to claim 1, comprising:
an E/O converter which converts a signal, which is obtained by synthesizing a carrier wave, which is given the frequency modulation by the frequency modulator, and amplitude data which has digital values which are outputted from the sigma-delta modulator, from an electric signal into an optical signal; and
an O/E converter which is connected to the E/O converter via an optical fiber and converts a converted signal from an optical signal into an electric signal, wherein a signal converted by the O/E converter is divided into the frequency-modulated carrier wave and the amplitude data by a filter, and
wherein the amplitude modulator performs amplitude modulation of the frequency-modulated carrier wave, which is separated, with the amplitude data that is separated.

8. The transmitting circuit apparatus according to claim 1, wherein the sigma-delta modulator has:
an n-th integrator generating a signal obtained by performing n-th integration of the amplitude modulation data,
a quantizer which quantizes the n-th-integrated signal into a digital value, and
a feedback circuit which feeds back the quantized value to an input value of the sigma-delta modulator,
wherein the quantized digital value becomes an output of the sigma-delta modulator, and
wherein the fed-back value is added to an input value of the sigma-delta modulator and is inputted into the n-th integrator.

9. The transmitting circuit apparatus according to claim 1, wherein the sigma-delta modulator has a plurality of low-order sigma-delta modulators that is connected in multiple stages, and
wherein outputs of the plurality of low-order sigma-delta modulators are connected to a differentiator including configuration expressed by $(1-z^{-1})^m$ in z-transform for a order m until the preceding stage respectively, and are synthesized.

10. A transmitting circuit apparatus comprising:
a frequency modulator that performs frequency modulation of a carrier wave with frequency modulation data and outputs the frequency-modulated carrier wave;
a sigma-delta modulator which performs sigma delta modulation of amplitude modulation data; and
an amplitude modulator that performs amplitude modulation of the frequency-modulated carrier wave with an output signal of the sigma-delta modulator and outputs the amplitude-modulated carrier wave;
wherein the frequency modulator has a phase comparator, a loop filter, a voltage-controlled oscillator, a mixer, and an IF modulator,
wherein the IF modulator outputs a modulated wave signal at an intermediate frequency that is given frequency modulation with the frequency modulation data,
wherein the mixer performs frequency conversion of an output signal of the voltage-controlled oscillator to an intermediate frequency with a channel selection signal,
wherein the phase comparator performs phase comparison of the frequency-converted signal to a modulated wave signal at the intermediate frequency,
wherein the loop filter reduces an unnecessary signal from the phase-compared signal, and
wherein the voltage-controlled oscillator outputs the frequency-modulated carrier wave by its oscillation frequency being controlled by the signal where the unnecessary signal is reduced.

11. The transmitting circuit apparatus according to claim 10, wherein the amplitude modulation data has multiple digital values, and
wherein the sigma-delta modulator modulates the amplitude modulation data to amplitude data having binary digital values.

12. The transmitting circuit apparatus according to claim 10, wherein the sigma-delta modulator is at least a second-order or higher-order sigma-delta modulator.

13. The transmitting circuit apparatus according to claim 10, comprising a band pass filter which reduces an unnecessary signal out of a transmitted frequency band of an output signal of the amplitude modulator and outputs the output signal.

14. The transmitting circuit apparatus according to claim 10, wherein the amplitude modulator has a power amplifier and performs amplitude modulation by controlling a power supply of the power amplifier on the basis of an output signal of the sigma-delta modulator.

15. The transmitting circuit apparatus according to claim 10, comprising:
a first E/O converter that converts the frequency-modulated carrier wave from an electric signal into an optical signal;

a first O/E converter that is connected to the first E/O converter via an optical fiber and converts an optical signal, which is converted by the first E/O converter, into an electric signal;

a second E/O converter that converts an output signal of the sigma-delta modulator into an optical signal whose wavelength is different from that of an output of the first E/O converter;

a second O/E converter that is connected to the second E/O converter via the optical fiber and converts an optical signal, which is converted by the second E/O converter, into an electric signal, wherein an output signal of the second E/O converter is synthesized with an output signal of the first E/O converter, and is branched after being transmitted via the optical fiber to be converted into an electric signal from the optical signal by the second O/E converter, and wherein the amplitude modulator performs amplitude modulation of an output signal of the first O/E converter with an output signal of the second O/E converter.

16. The transmitting circuit apparatus according to claim 10, comprising:

an E/O converter which converts a signal, which is obtained by synthesizing a carrier wave, which is given the frequency modulation by the frequency modulator, and amplitude data which has digital values which are outputted from the sigma-delta modulator, from an electric signal into an optical signal; and an O/E converter which is connected to the E/O converter via an optical fiber and converts a converted signal from an optical signal into an electric signal, wherein a signal converted by the O/E converter is divided into the frequency-modulated carrier wave and the amplitude data by a filter, and wherein the amplitude modulator performs amplitude modulation of the frequency-modulated carrier wave, which is separated, with the amplitude data that is separated.

17. The transmitting circuit apparatus according to claim 10, wherein the sigma-delta modulator has:

an n-th integrator generating a signal obtained by performing n-th integration of the amplitude modulation data, a quantizer which quantizes the n-th-integrated signal into a digital value, and a feedback circuit which feeds back the quantized value to an input value of the sigma-delta modulator, wherein the quantized digital value becomes an output of the sigma-delta modulator, and wherein the fed-back value is added to an input value of the sigma-delta modulator and is inputted into the n-th integrator.

18. The transmitting circuit apparatus according to claim 10, wherein the sigma-delta modulator has a plurality of low-order sigma-delta modulators that is connected in multiple stages, and wherein outputs of the plurality of low-order sigma-delta modulators are connected to a differentiator including configuration expressed by $(1-z^{-1})^m$ in z-transform for a order m until the preceding stage respectively, and are synthesized.

* * * * *